US008687167B2

(12) United States Patent
Padiy et al.

(10) Patent No.: US 8,687,167 B2
(45) Date of Patent: Apr. 1, 2014

(54) LITHOGRAPHIC APPARATUS AND DEVICE MANUFACTURING METHOD

(75) Inventors: Alexander Viktorovych Padiy, Geldrop (NL); Boris Menchtchikov, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 339 days.

(21) Appl. No.: 13/009,232

(22) Filed: Jan. 19, 2011

(65) Prior Publication Data

US 2011/0216293 A1 Sep. 8, 2011

Related U.S. Application Data

(60) Provisional application No. 61/306,065, filed on Feb. 19, 2010.

(51) Int. Cl.
*G03B 27/68* (2006.01)
*G03B 27/42* (2006.01)

(52) U.S. Cl.
USPC ........ 355/52; 355/53

(58) Field of Classification Search
USPC ........ 355/52, 53, 55, 67; 356/399–401
See application file for complete search history.

(56) References Cited

U.S. PATENT DOCUMENTS 5,989,761 A 11/1999 Kawakubo et al.
6,238,851 B1 * 5/2001 Nishi ........ 430/394
6,341,007 B1 1/2002 Nishi et al.
6,549,269 B1 4/2003 Nishi et al.
6,841,321 B2 * 1/2005 Matsumoto et al. ........ 430/30
6,979,522 B2 12/2005 Hommen et al.
7,075,618 B2 7/2006 Ina et al.
7,256,869 B2 * 8/2007 Nishi ........ 355/53
7,330,261 B2 2/2008 Van Haren et al.
7,468,795 B2 12/2008 Simons et al.
7,746,446 B2 6/2010 Okita
2007/0021860 A1 1/2007 Gertrudus Simons et al.
2008/0259297 A1 10/2008 Kawakubo
2009/0257035 A1 10/2009 Yabu

FOREIGN PATENT DOCUMENTS

CN 1242104 A 1/2000
EP 1 628 164 A2 2/2006
EP 1 744 217 A1 1/2007

(Continued)

OTHER PUBLICATIONS

International Search Report directed to related Internaional Patent Application No. PCT/EP2011/050438, mailed Jul. 7, 2011, European Patent Office, Rijswijk, Netherlands; 4 pages.

(Continued)

*Primary Examiner* — Hung H Nguyen
(74) *Attorney, Agent, or Firm* — Sterne, Kessler, Goldstein & Fox P.L.L.C.

(57) ABSTRACT

A method controls a scanning function of a lithographic apparatus. A first alignment strategy is used. A monitor wafer is exposed to determine baseline control parameters pertaining to the scanning function. The baseline control parameters are periodically retrieved from the monitor wafer. Parameter drift is determined from the baseline control parameters. Corrective action is taken based on the determination. A production wafer is exposed using a second alignment strategy, different to the first alignment strategy. The corrective action is modified so as to be substantially closer to the correction that would have been made had the second alignment strategy been used in exposing the monitor wafer.

26 Claims, 4 Drawing Sheets

(56) References Cited

FOREIGN PATENT DOCUMENTS

| | | | |
|---|---|---|---|
| JP | 08-330204 | A | 12/1996 |
| JP | 09-330862 | A | 12/1997 |
| JP | 10-163097 | A | 6/1998 |
| JP | 2002-222752 | A | 8/2002 |
| JP | 2002-367902 | A | 12/2002 |
| JP | 2003-197517 | A | 7/2003 |
| JP | 2004-524688 | A | 8/2004 |
| JP | 2007-027721 | A | 2/2007 |
| JP | 2009-069163 | A | 4/2009 |
| TW | 200710596 | A | 3/2007 |
| TW | 201007365 | A1 | 2/2010 |
| WO | WO 2005/096353 | A1 | 10/2005 |

OTHER PUBLICATIONS

International Preliminary Report on Patentability and Written Opinion of the International Searching Authority directed to related International Patent Application No. PCT/EP2011/050438, issued Aug. 21, 2012; 8 pages.

English-Language Abstract for Japanese Patent Publication No. 09-330862 A, published Dec. 22, 1997; 1 page.

English-Language Abstract for Japanese Patent Publication No. 2002-367902 A, published Dec. 20, 2002; 1 page.

* cited by examiner

SO
BD
IL
AD
IN
CO
LA
M2
MA
M1
MA
B
MT
PM
W
P1
P2
C
PL
Z
X
W
Y
X
WT
IF
PW

SCS
LC
SC x 4
LACU
I/O1
BK
CH
BK
CH
RO
TCU
LB
LA
I/O2
CH
BK
CH
BK
DE x 4

2
4
10
SM1
PU
W
I
z
λ
x

PU
18
11
SM2
12
13
17
14
2
F
16
15
W

LITHOGRAPHIC APPARATUS AND DEVICE MANUFACTURING METHOD

CROSS REFERENCE TO RELATED APPLICATIONS

This application claims benefit under 35 U.S.C. 119(e) to U.S. Provisional Patent Application 61/306,065, filed Feb. 19, 2010, which is incorporated by reference herein in its entirety.

FIELD

Embodiments of the present invention relate to methods and apparatus usable, for example, in the manufacture of devices by lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a "mask" or a "reticle," may be used to generate a circuit pattern to be foiined on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called "steppers," in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidths of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive foim of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometers are known. Spectroscopic scatterometers direct a broadband radiation beam onto the substrate and measure the spectrum (intensity as a function of wavelength) of the radiation scattered into a particular narrow angular range. Angularly-resolved scatterometers use a monochromatic radiation beam and measure the intensity of the scattered radiation as a function of angle.

In order to better control scanner functionality, a module has been recently devised which automatically drives the system towards a pre-defined baseline approximately each day. This scanner stability module retrieves standard measurements taken from a monitor wafer using a metrology tool. The monitor wafer had been previously exposed using a special reticle containing special scatterometry marks. Using the monitor wafer and that day's measurements (and possibly historical measurement data from previous days), the scanner stability module determines how far the system has drifted from its baseline, and then calculates wafer-level overlay and focus correction sets. The baseline can be defined either directly by the reference layer on the monitor wafer (in this case, the scanner stability module will drive the system towards minimal overlay on the baseline monitor wafers) or indirectly by a combination of the reference layer on the wafers and a target overlay fingerprint (in this case, the scanner stability module will drive the system towards the defined target overlay fingerprint on the monitor wafers). The lithography system then converts these correction sets into specific corrections for each exposure on subsequent production wafers.

Each scanner is controlled by the scanner stability module using a control thread, the contents of which are dependent on the alignment strategy used in exposing the wafers. Where the same alignment strategy is used in exposing the monitor wafers and production wafers, then the action of the scanner stability module will mean that the alignment strategy impact cancels out. However, should different alignment strategies be required for different products on one scanner, then a single control thread cannot normally be used to control that scanner.

SUMMARY

It is desirable to provide a system whereby a single scanner stability module thread per scanner can be run regardless of a number of alignment strategies required for exposing production wafers.

According to an embodiment of the present invention, there is provided a lithographic apparatus that includes the following: an illumination system configured to condition a radiation beam, a support configured to support a patterning device, the patterning device being capable of imparting the radiation beam with a pattern in its cross-section to form a patterned radiation beam, a substrate table configured to hold a substrate, a projection system configured to project the patterned radiation beam onto a target portion of the substrate, alignment apparatus for properly aligning the substrate according to an alignment strategy, prior to the projection of the patterned radiation beam onto a target portion of the substrate, and, a scanning control module operable to aid control of at least one of the support, substrate table or projection system by periodically retrieving measurements defining baseline control parameters from at least one reference substrate so as to determine parameter drift from the baseline control parameters thereby enabling correction to be made for the drift, the reference substrate having been initially exposed so as to determine the baseline control parameters, the initial exposure being performed using a first alignment strategy, the apparatus being further operable such that, when exposing a production substrate using a second alignment strategy, different to the first alignment strategy, to adjust the correction made for parameter drift so as to be substantially closer to the correction that would have been made had the second alignment strategy been used in exposing the at least one reference substrate.

According to a second embodiment of the present invention, there is provided a method of controlling scanning function of a lithographic apparatus including the following steps: exposing at least one reference substrate so as to determine baseline control parameters pertaining to the scanning function, the exposure being performed using a first alignment strategy, periodically retrieving the baseline control parameters from the least one reference substrate, determining parameter drift from the baseline control parameters and taking corrective action based on the determination, exposing a production substrate using a second alignment strategy, different to the first alignment strategy, and, modifying the corrective action so as to be substantially closer to the correction that would have been made had the second alignment strategy been used in exposing the at least one reference substrate.

Further features and advantages of embodiment of the present invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate embodiments of the present invention and, together with the description, further serve to explain the principles of embodiments of the invention and to enable a person skilled in the relevant art(s) to make and use embodiments of the present invention.

Figure 1:
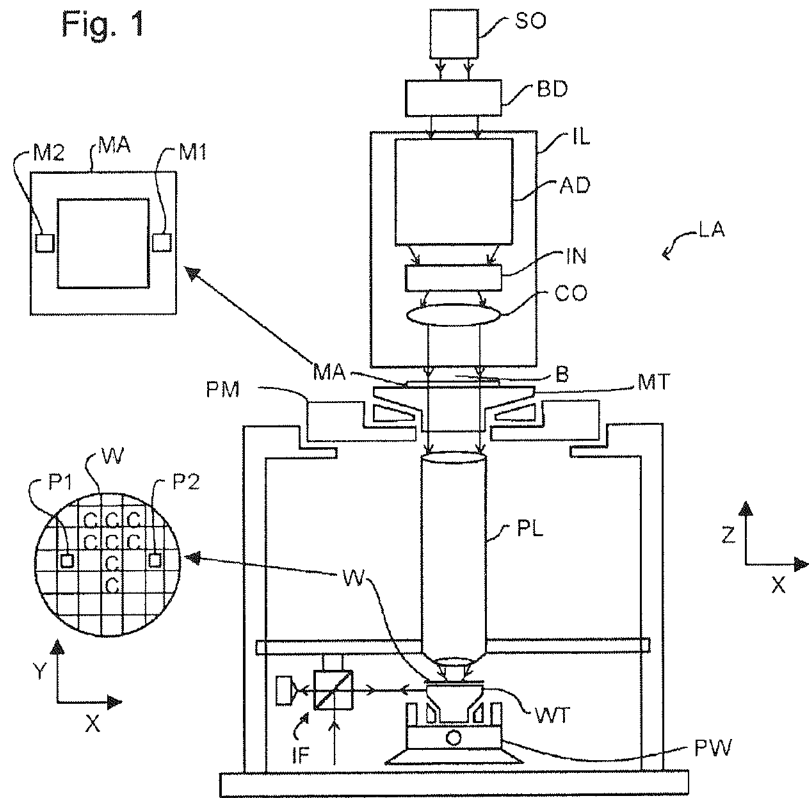
FIG. 1 depicts an example lithographic apparatus, which may be used with embodiments of the present invention.

The features and advantages of embodiments of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the relevant art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include the following: read only memory (ROM); random access memory (RAM); magnetic disk storage media; optical storage media; flash memory devices; and, electrical, optical, acoustical signals, and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts an example lithographic apparatus, which may be used with embodiments of the present invention. The apparatus includes the following an illumination system (illuminator) IL configured to condition a radiation beam. B (e.g., UV radiation or DUV radiation), support structure (e.g., a mask table) MT configured to support a patterning device (e.g., a mask) MA and connected to a first positioner PM configured to accurately position the patterning device in accordance with certain parameters, a substrate table (e.g., a wafer table) WT configured to hold a substrate (e.g., a resist coated wafer) W and connected to a second positioner PW configured to accurately position the substrate in accordance with certain parameters, and a projection system (e.g., a refractive projection lens system) PL configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports (i.e., bears the weight of the patterning device). It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate such as, for example, if the pattern includes phase-shifting features or so called assist features. Generally, the pattern imparted to the radiation beam will correspond to a particular functional layer in a device being created in the target portion, such as, for example, an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small minors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As depicted herein, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type where at least a portion of the substrate may be covered by a liquid having a relatively high refractive index, e.g., water, so as to fill a space between the projection system and the substrate. An immersion liquid may also be applied to other spaces in the lithographic apparatus such as, for example, between the mask and the projection system. Immersion techniques are well known in the art for increasing the numerical aperture of projection systems. The term "immersion" as used herein does not mean that a structure, such as a substrate, must be submerged in liquid, but rather means that liquid is located between the projection system and the substrate during exposure.

Referring to FIG. 1, the illuminator IL receives a radiation beam from a radiation source SO. The source and the lithographic apparatus may be separate entities such as, for example, when the source is an excimer laser. In such cases, the source is not considered to form part of the lithographic apparatus and the radiation beam is passed from the source SO to the illuminator IL with the aid of a beam delivery system BD include, for example, suitable directing mirrors and/or a beam expander. In other cases the source may be an integral part of the lithographic apparatus such as, for example, when the source is a mercury lamp. The source SO and the illuminator IL, together with the beam delivery system BD (if required) may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components such as, for example, an integrator IN and a condenser CO. The illuminator may be used to condition the radiation beam in order to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately (e.g., so as to position different target portions C in the path of the radiation beam B). Similarly, the first positioner PM and another position sensor (which is not explicitly depicted in FIG. 1) can be used to accurately position the mask MA with respect to the path of the radiation beam B (e.g., after mechanical retrieval from a mask library or during a scan) In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus can be used in at least one of the following modes:

1. In a step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In the step mode, the maximum size of the exposure field limits the size of the target portion C imaged in a single static exposure.

2. In a scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PL. In the scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this other mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device such as, for example, a programmable mirror array of a type as referred to above.

Combinations and/or variations on the above described modes of use or entirely different modes of use may also be employed.

Figure 2:
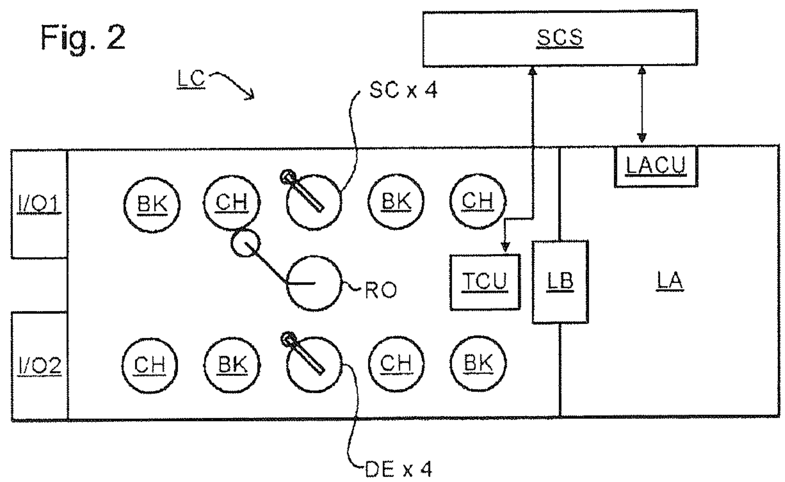
FIG. 2 depicts an example lithographic cell or cluster, which may be used with embodiments of the present invention.

As shown in FIG. 2, the lithographic apparatus LA, which may be used with embodiments of the present invention, forms part of a lithographic cell LC, also sometimes referred to a lithocell or cluster, which also includes an apparatus to perform pre- and post-exposure processes on a substrate. Conventionally, these include spin coaters SC to deposit resist layers, developers DE to develop exposed resist, chill plates CH and bake plates BK. A substrate handler, or robot RO, picks up substrates from input/output ports I/O1, I/O2, moves them between the different process apparatus and delivers them to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order to ensure that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked (to improve yield) or discarded, thereby avoiding performing exposures on substrates that are known to be faulty. In a case where only some target portions of a substrate are faulty, further exposures can be performed only on those target portions which are considered good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable rapid measurements, it is desirable that the inspection apparatus measure properties in the exposed resist layer immediately after the exposure. However, the latent image in the resist has a very low contrast (there is only a very small difference in refractive index between the parts of the resist which have been exposed to radiation and those which have not) and not all inspection apparatus have sufficient sensitivity to make useful measurements of the latent image. Therefore, measurements may be taken after the post-exposure bake step (PEB) which is customarily the first step carried out on exposed substrates and increases the contrast between exposed and unexposed parts of the resist. At this stage, the image in the resist may be referred to as "semi-latent." It is also possible to make measurements of the developed resist image (at which point either the exposed or unexposed parts of the resist have been removed) or after a pattern transfer step such as etching. The latter possibility limits the possibilities for rework of faulty substrates but may still provide useful information.

Figure 3:
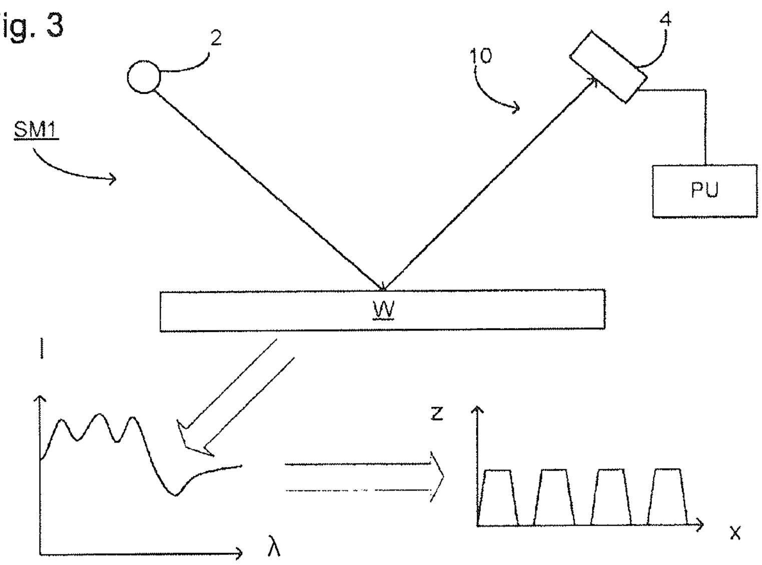
FIG. 3 depicts a first example of a scatterometer, which may be used with embodiments of the present invention.

FIG. 3 depicts an example scatterometer, which may be used in embodiments of the present invention. The scatterometer includes a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconfigured by processing unit PU (e.g., by Rigorous Coupled Wave Analysis and non-linear regression or by comparison with a library of simulated spectra as shown at the bottom of FIG. 3). In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
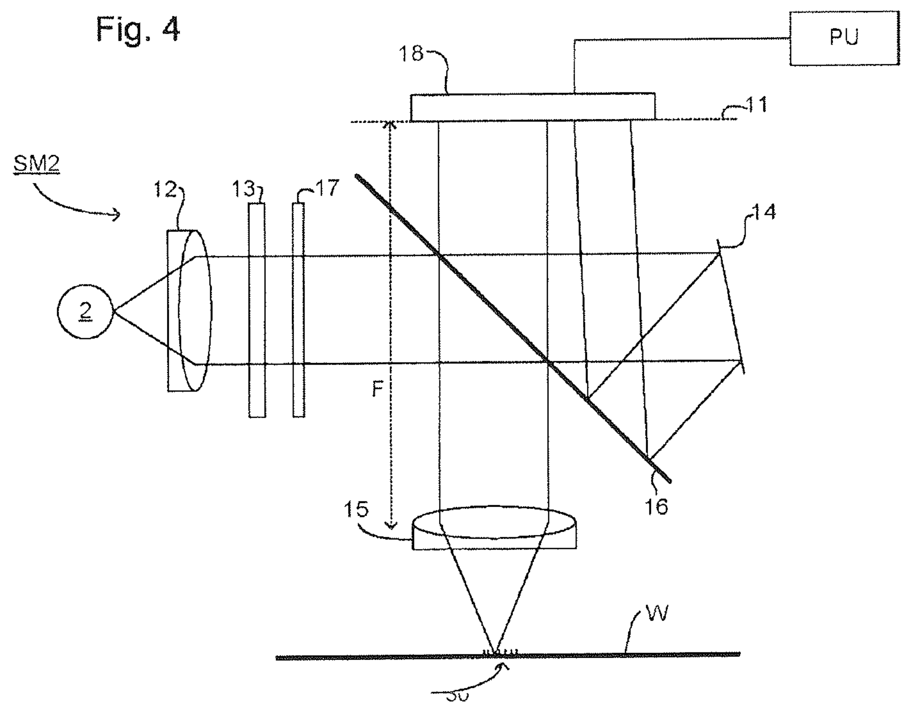
FIG. 4 depicts a second example of a scatterometer, which may be used with embodiments of the present invention.

Another scatterometer that may be used with embodiments of the present invention is shown in FIG. 4. In this device, the radiation emitted by radiation source 2 is collimated using lens system 12 and transmitted through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflecting surface 16 into a detector 18 in order to have the scatter spectrum detected. The detector may be located in the back-projected pupil plane 11, which is at the focal length of the lens system 15; however, the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference minor 14. The reference beam is then projected onto a different part of the same detector 18 or alternatively onto a different detector (not shown).

A set of interference filters 13 is available to select a wavelength of interest in the range of, for example, 405-790 nm or even lower, such as 200-300 nm. The interference filter may be tunable rather than include a set of different filters. A grating could be used instead of interference filters.

The detector 18 may measure the intensity of scattered light at a single wavelength (or narrow wavelength range), the intensity separately at multiple wavelengths, or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e., one with a wide range of light frequencies or wavelengths) is possible, which gives a large etendue, allowing the mixing of multiple wavelengths. The plurality of wavelengths in the broadband preferably each has a bandwidth of $\Delta\lambda$ and a spacing of at least $2\cdot\Delta\lambda$ (i.e., twice the bandwidth). Several "sources" of radiation can be different portions of an extended radiation source which have been split using fiber bundles. In this way, angle-resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A, which is incorporated by reference herein in its entirety.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes.

A key component of accurate lithography is an increased ability to control lithography scanners and scanning functionality (when referring to "scanners" it should be appreciated that this encompasses all the scan modes and functionality described herein and other scanning functionalities). Improvements to the scanner's focus and overlay (layer-to-layer alignment) uniformity have recently been achieved by the Baseliner™ scanner stability module, leading to an optimized process window for a given feature size and chip application, enabling the continuation the creation of smaller, more advanced chips.

When a lithography system is first installed, it must be calibrated to ensure optimal operation. However, over time, system performance parameters will drift. A small amount of drift can be tolerated, but with too much drift and the system will not likely meet specification. Consequently, manufacturers are required to stop production periodically for re-calibration. Calibrating the system more frequently gives a bigger process window, but consequently, at the cost of more scheduled downtime.

Among other benefits, the scanner stability module greatly reduces these production stoppages. In an embodiment, the scanner stability module automatically drives the system towards a pre-defined baseline on a regular basis (typically every few days). To do this, it retrieves standard measurements taken from one or more monitor wafers using a metrology tool. The monitor wafer is exposed using a special reticle containing special scatterometry marks. From that day's measurements, the scanner stability module determines how far the system has drifted from its baseline. It then calculates wafer-level overlay and focus correction sets. The lithography system then converts these correction sets into specific corrections for each exposure on subsequent production wafers.

For volume production, it is desirable to have full flexibility when assigning layers for exposure to a scanner. The alternative, layer-scanner dedication, would put monthly output capacity at risk, since any small disturbance of the litho-cluster would directly appear in the output of that month. One known approach to overcome this risk is by so called (overlay) grid matching. All scanner grids are intentionally offset a little, such that all scanners more or less have the same (average) grid for overlay. This grid is often referred to as 'holy' or 'golden' grid. Each product layer can now be exposed on each scanner of the same type. This 'golden' grid is exposed and etched onto so called 'reference wafers'. If these 'golden' matching wafers are used as the baseline for overlay stability control instead of random monitoring wafers, overlay grid matching and long-term stability can be achieved in a single automated step.

Figure 5:
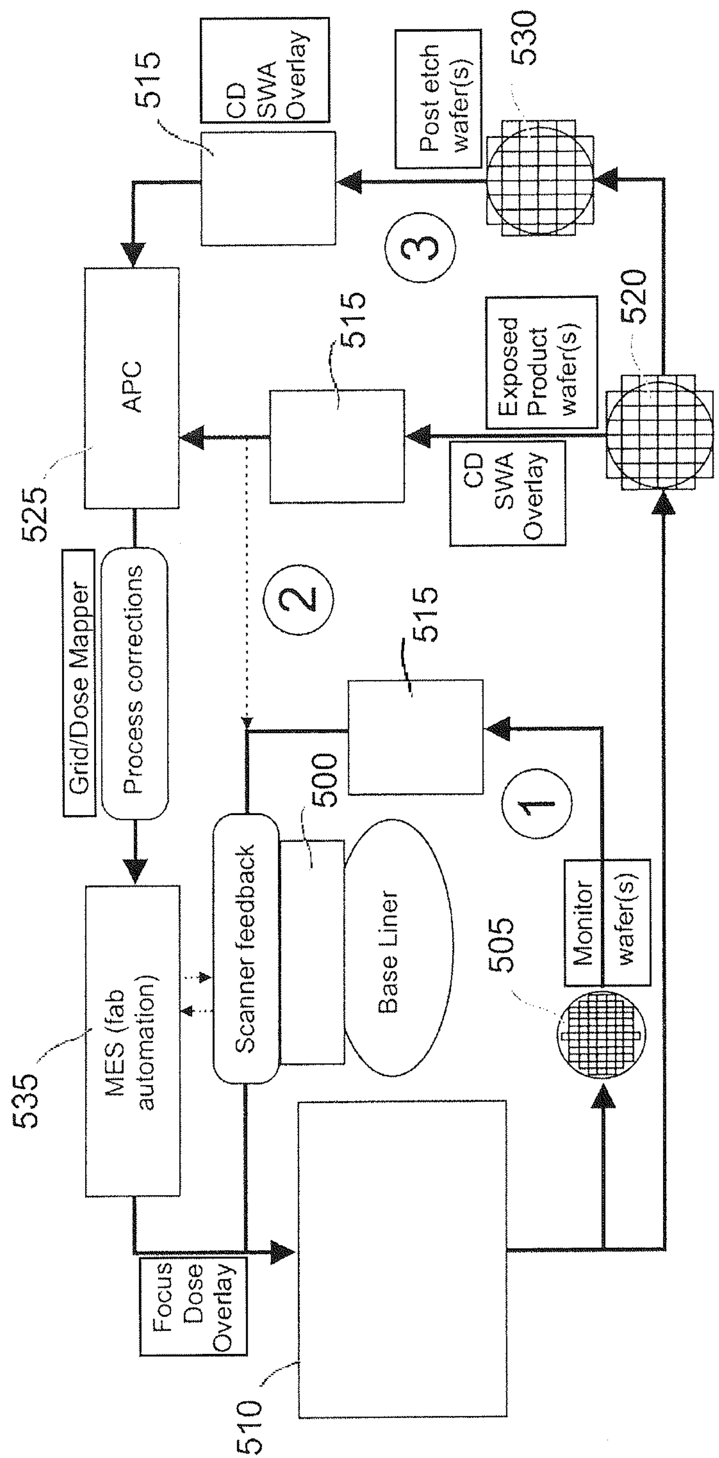
FIG. 5 illustrates an embodiment of control loops in a lithographic process utilizing a scanner stability module.

FIG. 5 depicts an embodiment of the overall lithography and metrology method incorporating the scanner stability module 500 (essentially an application running on a server, in this example). Shown are three main process control loops. In an embodiment, the first loop provides the local scanner control using the scanner stability module 500 and monitor wafers. The monitor wafer 505 is shown being passed from the main lithography unit 510, having been exposed to set the baseline parameters for focus and overlay. At a later time, metrology unit 515 reads these baseline parameters, which are then interpreted by the scanner stability module 500 so as to calculate correction routines so as to provide scanner feedback 550, which is passed to the main lithography unit 510, and used when performing further exposures.

In an embodiment, the second Advanced Process Control (APC) loop is for local scanner control on-product (e.g., determining focus, dose, and overlay). The exposed product wafer 520 is passed to metrology unit 515 where information relating to, for example, the critical dimensions, sidewall angles and overlay is determined and passed onto the Advanced Process Control (APC) module 525. This data is also passed to the scanner stability module 500. Process corrections 540 are made before the Manufacturing Execution System (MES) 535 takes over, providing scanner control to the main lithography unit 510, in communication with the scanner stability module 500.

In an embodiment, the third loop allows metrology integration into the second APC loop (e.g., for double patterning). The post etched wafer 530 is passed to metrology unit 515 which again passes information relating to, for example, the critical dimensions, sidewall angles and overlay, read from the wafer, to the Advanced Process Control (APC) module. The loop continues the same as with the second loop.

Figure 6:
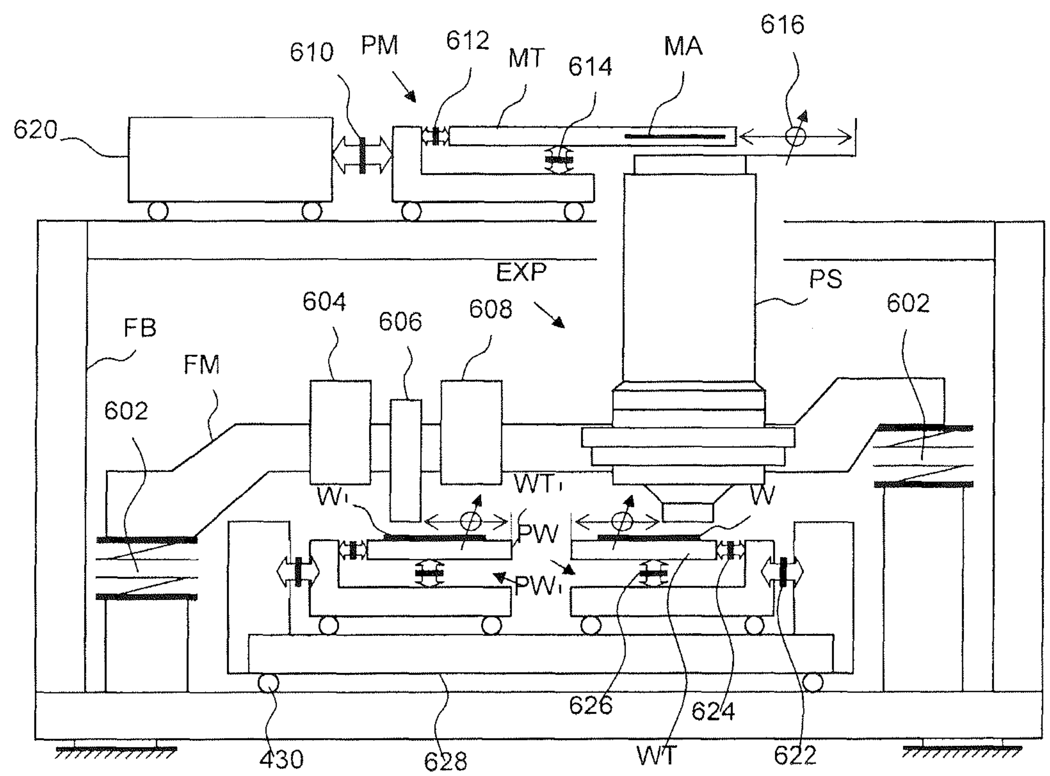
FIG. 6 is a schematic diagram showing components of a lithographic apparatus having separate measurement and exposure stages, usable in an embodiment of the invention.

FIG. 6 shows schematically the arrangement of one embodiment of the apparatus of FIG. 1, in which the apparatus has dual substrate supports and separate metrology and exposure stations.

A base frame FB supports and surrounds the apparatus on the ground. Within the apparatus, and serving as an accurate positional reference, a metrology frame FM is supported on air bearings 602, which isolate it from vibrations in the environment. Mounted on this frame are the projection system PS, which naturally forms the core of the exposure station EXP, and also instruments 604, 606, 608, which are the functional elements of the metrology station MET. Above these stations, the mask table MT and mask MA are mounted above the projection system PS. The first positioner PM comprises long-throw (coarse) actuators 610 and short-throw (fine) actuators 612, 614, as described above. These operate by active feedback control to obtain the desired position of mask MA with respect to the projection system PS, and hence with respect to metrology frame FM. This measurement is indicated schematically at 616. The whole positioning mechanism for the mask MA is supported on the base frame at B via active air bearings 618, etc. A balance mass 620 is provided to mimic at least coarse movements of the mask table MT and positioning in order to reduce vibrations being transmitted into the frame and other components. A low frequency servo control keeps balance mass 620 in a desired average position. Wafer table WT shown beneath the projection system similarly has coarse actuators 622 and fine actuators 624, 626 for positioning substrate W accurately with respect to the exit lens of the projection system PS. Additionally, according to the dual-stage arrangement of this example, a duplicate wafer table WT' and positioning mechanism PW' are provided. As illustrated, these duplicate elements are supporting a second substrate W' at the metrology station MET. Wafer tables WT, WT' and their respective positioners PW and PW' are carried on and connected to a shared balance mass 628. Again, air bearings, or other suitable bearings such as magnetic, electrostatic and so forth, are shown schematically, for example at 630. Measurements of wafer table position used for the coarse and fine control of the positions of the wafers W and W' are made relative to elements 606 at the metrology station and PS at the exposure station, both of these ultimately referring back to metrology frame FM.

Figure 7:
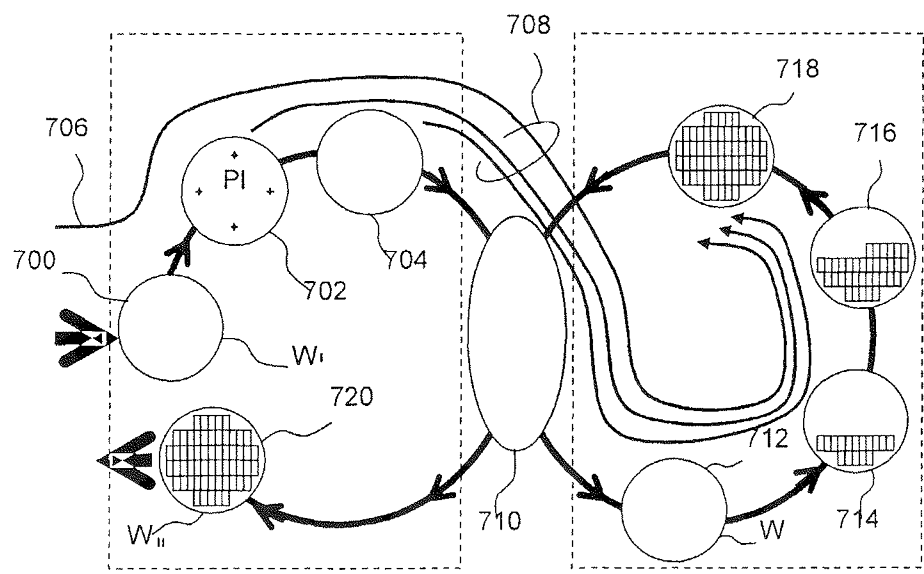
FIG. 7 illustrates schematically the stages in the measurement and exposure processes in the apparatus of FIG. 6, according to known practice.

FIG. 7 illustrates the steps in this twin-stage apparatus of FIG. 6 to expose dies on a substrate W, according to an embodiment of the present invention. On the left hand side within a dotted box are steps performed at metrology station MET, while the right hand side shows steps performed at the exposure station EXP. A substrate W has already been loaded into the exposure station. A new substrate W' is loaded to the apparatus by a mechanism not shown at step 700. These two substrates are processed in parallel in order to increase the throughput of the metrology process as a whole. Referring initially to the newly-loaded substrate W', this may be a previously unprocessed substrate, prepared with a new photoresist for first time exposure in the apparatus. In general, however, the lithography process described will be merely one step in a serious of exposure and processing steps, so that substrate W' has been through this apparatus and/or other lithography, several times already, and may have subsequent processes to undergo as well. At 702, alignment measurements using the substrate marks P1 etc. and image sensors IAS1 etc. are used to measure and record alignment of the substrate relative to substrate table WT. In practice, several marks across the substrate W' will be measured, to establish the "wafer grid," which maps very accurately the distribution of marks across the substrate, including any distortion relative to a nominal regular grid. At step 704, a map of wafer height against X-Y position is measured also, for use in accurate focusing of the exposed pattern.

When substrate W' is loaded, recipe data 706 is received, defining the exposures to be performed, and also properties of the wafer and the patterns previously made and to be made upon it. To these recipe data are added the measurements made at 702, 704, so that a complete set of recipe and metrology data 708 can be passed to the exposure stage. At 710, wafers W' and W are swapped, so that the measured substrate W' becomes the substrate W entering the exposure apparatus. This swapping is performed by exchanging the supports WT and WT' within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WT (formerly WT') is all that is necessary to make use of the measurement information 702, 704 for the substrate W (formerly W') in control of the exposure steps. At step 712, reticle alignment is performed using the mask alignment marks M1, M2 (FIG. 3C). In steps 714, 716, 718, scanning motions and radiation pulses are applied at successive die locations across substrate W, in order to complete the exposure of a number of patterns. Thanks to the alignment and level map data, these patterns are accurately aligned with respect to desired locations, and, in particular, with respect to features previously laid down on the same substrate. The exposed substrate, now labeled $W_{H}$ is unloaded from the apparatus at step 720, to undergo etching or other processes, in accordance with the exposed pattern.

By employing the separate substrate tables, the performance of the apparatus in terms of substrate throughput through the exposure stages is maintained, while permitting a relatively time-consuming set of measurements to be performed to characterize the wafer and patterns previously deposited upon it. On the other hand, the provision of dual stages, each with its respective positioner PW, PW' sensors etc. adds significantly to the cost of the apparatus. Moreover, since there is a definite time interval (for example 30-60 seconds) between performance of the measurements in steps 702, 704 and the ultimate exposure, using those measurements in steps 714, 716, 718, a risk arises that the dimensions of the substrate and its position, both globally and locally, would change prior to exposure (grid drift), leading to a loss of accuracy in alignment (overlay error). In particular, although the temperature of the environment both within and outside the apparatus is very carefully controlled, even slight temperature variations arising over a time interval of 30 seconds or so can be enough to cause distortion of the pattern as laid on the wafer.

In an embodiment, the scanner stability module product definition assumes that only overlay data (as measured by an inspection apparatus of the types described above) are used for controlling the scanner in terms of adjustments relevant for on-product overlay. This means that the scanner stability module is capable of monitoring/controlling the combined effect of both of the following: alignment error due to measure-side (MET side) grid drift; and exposure error due to the relative drift of the exposure-side grid with respect to the measure-side grid, but is unable to separate the two effects from each other.

It should be noted that for the same measure-side grid drift, the alignment error can be different for exposures that use different alignment strategies (i.e., number of marks, mark positions, and alignment model).

If all overlay-critical customer on-product exposures are performed using similar alignment mark distributions and alignment models, then the problem can be alleviated by using comparable alignment strategies for the scanner stability module monitor wafers, as this results in the impact of measure-side grid canceling out.

However, if customer uses different alignment strategies for different products (e.g., high-order wafer align model for some layers and linear model for other layers), then a single scanner stability module control thread is not capable of fully controlling the scanner, and multiple threads need to be used—each with an alignment strategy that is similar to the alignment strategy used by the customer for the corresponding group of products.

However, using multiple scanner stability module threads for each scanner has a negative impact on the availability of both the scanner and inspection apparatus, while also complicating fabrication automation. Furthermore, the need for multiple threads to match each product negates a main advantage of the scanner stability module concept, which is to separate control of the customer product/process from the scanner control.

A way of addressing this issue is to include control of alignment related effects in the scanner stability module functionality. This would allow the running of a single scanner stability module thread per scanner regardless of the number of different alignment strategies used for on-product exposures.

To achieve this, measure-side grid information can be gathered using the scanner stability module monitor wafers. In particular, alignment information generated by the scanner apparatus such as, for example, the coordinates of all measured alignment marks etched into the monitor wafers and the description of the alignment model used for exposing the monitor wafers should be made available to the scanner stability module controller. This enables the scanner stability module to determine measure-side scanner grid drift and to calculate its impact on on-product overlay even when a customer uses an alignment strategy different from the one used for exposing the monitor wafers.

Four main embodiments are described for doing this. A first embodiment uses the same alignment strategy for all monitor wafers regardless of the alignment strategy used by the customer. This uses a fixed simple alignment model, hereinafter referred to as the monitor alignment strategy.

The scanner models the shape of the wafer (as the wafer may be non-flat due to processing-induced warpage and/or due to non-ideal clamping) by measuring the positions of alignment marks printed on the wafer. Most customers typically measure approximately 20 alignment marks and fit a 6-parameter linear wafer shape model (e.g., translation x, translation y, symmetric rotation rs, asymmetric rotation ra, symmetric magnification ms, asymmetric magnification ma). Some customers use 4-parameter model (e.g., translation x, translation y, symmetric rotation rs, symmetric magnification ins). Accuracy of fitting the actual shape of the wafer can be improved by increasing the number of alignment marks measured (which effectively reduces measurement noise) and by using higher-order models (which reduces the mismatch between the actual wafer shape and the model fit). However, the number of alignment marks that can be measured is limited by the time that the wafer can spend at the measure side of the lithography apparatus in order not to decrease the throughput (exposed wafers per hour).

Different customers use different alignment mark positions for their different products depending on the product-specific layout restrictions. The scanner stability module should measure enough alignment marks such as to be able to predict the alignment results for as many customer products as possible. In particular, it should attempt to measure alignment marks in the vicinity of all positions on the wafer where the alignment marks on the customer products are placed.

The alignment data is measured for each wafer at the measure-side of the scanner apparatus immediately before being exposed at the exposure-side. The scanner uses the alignment data to compute the wafer shape distortion in XY and to compensate for it during exposure with the aim of improving overlay. This is also true for the monitor wafers. The main steps of this procedure are as follows: the alignment marks are measured; wafer deformation is computed (per wafer) by fitting the fixed, simple alignment model (the monitor alignment strategy) through the raw alignment data measured in the previous step; exposure routing is adjusted using the modeled data, so as to partially compensate the wafer deformation in XY; and, the wafer is exposed.

Then, using the inspection apparatus/scatterometer (offline), overlay on the monitor wafers is measured. Based on this overlay data, scanner baseline constants (SBC—the parameters defining the baseline for the scanner stability module) are calculated for the alignment strategy used for exposing the monitor wafers, (i.e., the monitor alignment strategy). Based on the alignment data measured by scanner from the monitor wafers (and the known alignment strategy) it is possible to compute the impact on overlay caused by the difference between the monitor alignment strategy and the alignment strategy used for the different customer product models. If the customer products use the same alignment strategy, then the scanner-induced overlay error as measured on the monitor wafers is representative for the customer product as well.

However, if the customer product uses a different alignment strategy, the following steps should be performed: compute the effect of the monitor alignment strategy on overlay (using the alignment data that was measured by the scanner before exposing the monitor wafers); compute (using the same alignment data measured by the scanner before exposing the monitor wafers) the correction that the customer product alignment strategy would have performed if it had been used for exposing the monitor wafers; and, compute the difference between the two alignment strategies, and make this computed difference available to the scanner (when exposing each group of products that use the same alignment strategy). Alternatively, the computed difference can then be made available to the customer, or used to automatically adjust the scanner stability module SBC parameters before exposing the product lots.

This difference between the alignment strategies can be computed by the controller for a pre-defined set of alignment strategies and made available to the scanner (e.g., in the form of an array of corrections). This allows the scanner to apply the appropriate array when exposing the customer product (in which selection should be made by comparing the alignment strategy used for the product with the alignment strategies for which the correction is computed).

In a second embodiment the monitor wafers are exposed as two jobs, each job using its own alignment strategy includes the following: a simple alignment strategy is used for the first job (e.g., as described in first embodiment above, making sure that measure-exposure timings for these scanner stability module wafers is similar to the product wafers). The aim of this job is to provide overlay information via the scatterometer; and a full alignment is used for the second job (using an extensive number of alignment marks as required to accurately map the measure-side grid of the scanner, regardless of whether that requires deviation from the product settings in terms of the measure-exposure timings). The aim of this job is to gather information about the measure-side grid drift.

Using the inspection apparatus/scatterometer (offline), overlay on the monitor wafers from the first job is measured. Based on this overlay data, scanner baseline constants (SBC) are calculated for the alignment strategy used when exposing the first job of monitor wafers.

Based on the alignment data measured by the scanner from the second job of monitor wafers, the scanner stability module controller is then able to compute the difference between each of the customer alignment models and the alignment model used for the first job of the monitor wafers (in a similar way as in the first embodiment), and then either make the computed difference available to the customer, or automatically adjust the scanner stability module SBC parameters before exposing the product lots, depending on the alignment strategy used for the customer product lots.

In this case, monitor wafers from the second job can be used for gathering additional scanner-specific information for the parameters that are insensitive to the induced measure-exposure difference in timings (e.g., related to intra-field fingerprint or focus).

In the first embodiment, timing is the limiting factor, so only a limited number of marks can be measured. Consequently, there may be customer products that align on marks that are too far from the alignment marks measured on monitor wafers. This could be a significant source of error when computing the effect of the customer product alignment strategy using "non-native" monitor alignment data. By "non-native" alignment data it is meant that, instead of using actual alignment measurements at the customer alignment mark positions, alignment data measured at monitor alignment mark positions is used. This is because monitor alignment data (i.e., the measurement of positions of the alignment marks corresponding to the monitor alignment strategy) is used for computing the effect of a customer alignment strategy which uses different alignment mark positions (with respect to the positions of the monitoring alignment marks). This leads to accuracy loss.

By comparison, in the second embodiment, a very dense sampling of alignment marks can be achieved as wafer timing is no longer important. Therefore, this issue is alleviated since a monitor alignment mark can always be found that is in the near vicinity of any customer alignment mark position, and is therefore representative of it. If the customer alignment mark position (not necessarily measured on the monitor wafers) and the measured monitor alignment mark position are close to each other, then use of the monitor alignment data (measured on the monitor mark positions) for the customer alignment mark positions leads to a small interpolation error. Different approaches can be followed here: either the closest neighbor data can be used; or, averaging of multiple measured alignment positions around the customer mark position can be used.

The third embodiment is similar to the first, but instead of computing the difference between the alignment models in the scanner stability module controller, the scanner computes the impact of the measure-side grid drift on the customer lots using the raw alignment data gathered during exposure of the monitor wafers. Similarly, the fourth embodiment is similar to the second, but using the scanner to compute the impact of the measure-side grid drift on the customer lots using the raw alignment data gathered during exposure of the second job of monitor wafers.

By performing these methods, for each group of customer products that use an alignment strategy different to the monitor alignment strategy, it is possible to virtually model the situation as if it was the customer product alignment strategy that had been used for exposing the monitor wafers.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered synonymous with the more general terms "substrate" or "target portion," respectively. The substrate referred to herein may be processed, before or after exposure, in for example a track (a tool that typically applies a layer of resist to a substrate and develops the exposed resist), a metrology tool, and/or an inspection tool. Where applicable, the disclosure herein may be applied to such and other substrate processing tools. Further, the substrate may be processed more than once such as, for example, in order to create a multi-layer IC so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157, or 126 nm) and extreme ultra-violet (EUV) radiation (e.g., having a wavelength in the range of 5-20 nm), as well as particle beams such as, for example, ion beams or electron beams.

The term "lens," where the context allows, may refer to any one or combination of various types of optical components, including refractive, reflective, magnetic, electromagnetic, and electrostatic optical components.

While specific embodiments of the invention have been described above, it will be appreciated that the invention may be practiced otherwise than as described. For example, embodiments of the present invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to embodiments of the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of embodiments of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present invention should not be limited by any of the above-described exemplary embodiments, but should be defined only in accordance with the following claims and their equivalents.

What is claimed is:

1. A lithographic apparatus comprising:

an illumination system configured to condition a radiation beam;

a support configured to support a patterning device, the patterning device being capable of imparting the radiation beam with a pattern in its cross-section to form a patterned radiation beam;

a substrate table configured to hold a substrate;

a projection system configured to project the patterned radiation beam onto a target portion of the substrate, an alignment apparatus configured to align the substrate according to an alignment strategy, prior to the projection of the patterned radiation beam onto a target portion of the substrate; and a scanning control module configured to control at least one of the support, substrate table, and projection system by periodically retrieving measurements that define baseline control parameters from one or more monitor wafers to determine a parameter drift from the baseline control, the one or more wafers having been initially exposed using a first alignment strategy;

wherein the apparatus is configured to, when exposing a production substrate using a second alignment strategy different from the first alignment strategy, adjust a correction made for the parameter drift, thereby being substantially closer to the correction that would have been made had the second alignment strategy been used in exposure of the one or more monitor wafers;

wherein the scanning control module is further configured to determine a difference between effects of the second and first alignment strategies during exposure of a substrate and to use the difference to adjust the correction.

2. The apparatus of claim 1, wherein the scanning control module is configured to determine the difference between the effects of the second and first alignment strategies from:

a determination of the effect of the first alignment strategy on overlay measurements read from at least one monitor wafer and the alignment data measured by the lithographic apparatus when in the process of exposing the at least one monitor wafer; and a determination, based on the second alignment strategy and the alignment data measured by the lithographic apparatus, of the correction that the second alignment strategy would perform if it had been used in exposing the at least one monitor wafer.

3. The apparatus of claim 2, wherein the scanning control module is configured to determine the difference between the effects of the use of the second and first alignment strategies.

4. The apparatus of claim 3, wherein the scanning control module is configured to propagate the determined difference between the effects of the use of the second and first alignment strategies to at least one of the illumination system, the substrate table, the projection system, and the alignment apparatus.

5. The apparatus of claim 3, wherein the scanning control module is configured to propagate differences between the effects of the use of a number of predetermined alignment strategies and the first alignment strategy to at least one of the illumination system, the substrate table, the projection system, and the alignment apparatus.

6. The apparatus of claim 3, wherein the scanning control module is configured to adjust the baseline control parameters based on the determined difference between the effects of the second and first alignment strategies.

7. The apparatus of claim 2, further comprising a controller module in the lithographic apparatus, wherein the controller module is configured to determine the difference between the effects of the second and first alignment strategies.

8. The apparatus of claim 1, wherein the lithographic apparatus is configured to expose a plurality of monitor wafers using the same alignment strategy.

9. The apparatus of claim 8, wherein the plurality of monitor wafers each include one or more alignment marks, the alignment marks in alignment with alignment, marks on production substrates.

10. The apparatus of claim 9, wherein the lithographic apparatus is configured to apply exposure durations for each of the plurality of monitor wafers that are substantially similar to exposure durations for the production substrates.

11. The apparatus of claim 1, wherein the lithographic apparatus is configured to use a plurality of monitor wafers in two sets and to expose the first set of monitor wafers using the first alignment strategy, and to expose the second set of monitor wafers using a plurality of alignment marks so as to accurately map a reference grid for the alignment apparatus.

12. The apparatus of claim 11, wherein the scanning control module is configured to obtain overlay information from the first set of monitor wafers and to obtain information relating to parameter drift of the alignment apparatus from the second set of monitor wafers.

13. The apparatus of claim 12, wherein the lithographic apparatus is configured to apply exposure durations for each of the first set of monitor wafers that are substantially similar to exposure durations for one or more production substrates, while exposure durations for each of the second set of monitor wafers are not based on the exposure durations for the one or more production substrates.

14. A method comprising:

exposing at least one monitor wafer so as to determine baseline control parameters pertaining to a scanning function, the exposure being performed using a first alignment strategy;

periodically retrieving the baseline control parameters from the at least one monitor wafer;

determining parameter drift from the baseline control parameters and making a correction based on the determination;

exposing a production substrate using a second alignment strategy, wherein the second alignment strategy is different from the first alignment strategy; and modifying the correction so as to be substantially closer to an anticipated correction that would have been made had the second alignment strategy been used in exposing the at least one monitor wafer;

wherein the modifying the correction comprises determining a difference between effects of the second and first alignment strategies during exposure of a substrate and applying the difference to adjust the correction.

15. The method of claim 14, wherein the determining the difference between the effects comprises:

determining the effect of the first alignment strategy on overlay measurements read from the at least one monitor wafer and the alignment data measured by the lithographic apparatus when exposing the at least one monitor wafer; and determining, based on the second alignment strategy and the alignment data measured by the lithographic apparatus, the correction that the second alignment strategy would perform if it had been used in exposing the at least monitor wafer.

16. The method of claim 15, wherein the determining the difference between the effects comprises using a scanning control module to determine the difference between the effects of the first and second alignment strategies.

17. The method of claim 16, wherein the determining the difference between the effects comprises propagating the determined difference between the effects of the use of the second and first alignment strategies to at least one of the illumination system, the substrate table, the projection system, and the alignment apparatus.

18. The method of claim 16, wherein the determining the difference between the effects comprises propagating differences between the effects of the use of a number of predetermined alignment strategies and the first alignment strategy to at least one of the illumination system, the substrate table, the projection system, and the alignment apparatus.

19. The method of claim 16, wherein the determining the difference between the effects comprises adjusting the baseline control parameters based on the determined difference between the effects of the second and first alignment strategies.

20. The method of claim 15, further comprising determining the difference between the effects of the second and first alignment strategies using a controller module in the lithographic apparatus.

21. The method of claim 14, wherein the exposing at least one monitor wafer comprises exposing a plurality of monitor wafers, wherein each of the monitor wafers is exposed using the same alignment strategy.

22. The method of claim 21, wherein exposing the plurality of monitor wafers comprises exposing the one or more monitor wafers with one or more respective alignment marks, the alignment marks in alignment with alignment marks on production substrates.

23. The method of claim 22, wherein exposing the plurality of monitor wafers comprises exposing the one or more monitor wafers with exposure durations substantially similar to exposure durations of each of production substrates.

24. The method of claim 14, wherein the exposing at least one monitor wafer comprises:

using a plurality of monitor wafers in two sets;

exposing the first set of monitor wafers using the first alignment strategy; and exposing the second set of monitor wafers using a plurality of alignment marks so as to accurately map a reference grid for an alignment apparatus.

25. The method of claim 24, wherein exposing the first set of monitor wafers comprises obtaining overlay information, and exposing the second set of monitor wafers comprises obtaining information pertaining to parameter drift of the alignment apparatus.

26. The method of claim 25, wherein the exposing at least one monitor wafer comprises using exposure durations for each of the first set of monitor wafers that are substantially similar to exposure durations for one or more production substrates, while the exposure durations of the second set of monitor wafers are not based on the exposure duration for the one or more production substrates.

* * * * *